(12) United States Patent
Feng et al.

(10) Patent No.: US 12,451,416 B2
(45) Date of Patent: Oct. 21, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Jun-Hao Feng, Taichung (TW); You-Chen Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 157 days.

(21) Appl. No.: 18/310,985

(22) Filed: May 2, 2023

(65) Prior Publication Data

US 2024/0222250 A1 Jul. 4, 2024

(30) Foreign Application Priority Data

Dec. 30, 2022 (TW) .................................. 111150977

(51) Int. Cl.
| | |
|---|---|
| *H01L 23/49* | (2006.01) |
| *H01L 21/48* | (2006.01) |
| *H01L 23/498* | (2006.01) |
| *H05K 1/11* | (2006.01) |
| *H05K 3/46* | (2006.01) |
| *H01L 25/065* | (2023.01) |
| *H01L 25/16* | (2023.01) |
| *H05K 1/18* | (2006.01) |

(52) U.S. Cl.
CPC ...... *H01L 23/49827* (2013.01); *H01L 21/486* (2013.01); *H05K 1/119* (2013.01); *H05K 3/4602* (2013.01); *H01L 25/0655* (2013.01); *H01L 25/16* (2013.01); *H05K 1/181* (2013.01); *H05K 2201/10015* (2013.01); *H05K 2201/10022* (2013.01); *H05K 2201/1003* (2013.01); *H05K 2201/10522* (2013.01)

(58) Field of Classification Search
CPC ...... H01L 23/49827; H05K 1/112–115; H05K 2201/09481; H05K 2201/0187
USPC .......................................................... 174/262
See application file for complete search history.

(56) References Cited

U.S. PATENT DOCUMENTS

2008/0289866 A1* 11/2008 Yuri ................ H01L 23/49822
257/E23.079
2021/0098421 A1* 4/2021 Wu ................... H01L 23/49811

* cited by examiner

*Primary Examiner* — Stanley Tso
*Assistant Examiner* — Sidi M Maiga
(74) *Attorney, Agent, or Firm* — Studebaker Brackett PLLC

(57) ABSTRACT

An electronic package is provided, in which a conductive structure and a reinforced insulation portion are bonded to a dielectric layer, and the reinforced insulation portion is in contact with and abuts against the conductive structure, such that the reinforced insulation portion can support the conductive structure to prevent the conductive structure from cracking when an electronic structure is disposed on the dielectric layer and electrically connected to the conductive structure.

10 Claims, 5 Drawing Sheets

ELECTRONIC PACKAGE AND MANUFACTURING METHOD THEREOF

BACKGROUND

1. Technical Field

The present disclosure relates to a semiconductor packaging process, and more particularly, to an electronic package and manufacturing method thereof capable of improving process yield.

2. Description of Related Art

With the vigorous development of the electronic industry, electronic products are also gradually developing towards to the trend of multi-function and high-performance. Technologies currently applied in the field of chip packaging include, for example, flip-chip packaging modules such as chip scale package (CSP), direct chip attached (DCA), or multi-chip module (MCM).

FIG. 1 is a schematic cross-sectional view of a conventional electronic package 1. As shown in FIG. 1, the conventional electronic package 1 includes an encapsulation layer 15 embedded with a plurality of electronic structures 11 and a plurality of conductive pillars 13, and a first circuit structure 10 and a second circuit structure 16 disposed on opposing two sides of the encapsulation layer 15 respectively. The first circuit structure 10 has at least a dielectric layer 14 and a circuit layer 12 formed on the dielectric layer 14, such that the electronic structures 11 are disposed on and electrically connected to the circuit layer 12 via solder bumps 110, and the conductive pillars 13 are erected on and electrically connected to the circuit layer 12.

However, in the manufacturing process of the conventional electronic package 1, the dielectric layer 14 is often unable to withstand the pressure of the electronic structures 11 when the electronic structures 11 are disposed on the dielectric layer 14, such that the circuit layer 12 is prone to be cracked, resulting poor process yield.

Therefore, how to overcome the aforementioned drawbacks of the prior art has become an urgent issue to be addressed at present.

SUMMARY

In view of the various shortcomings of the prior art, the present disclosure provides an electronic package, which comprises: a dielectric layer; a conductive structure bonded to the dielectric layer; a reinforced insulation portion bonded to the dielectric layer and abutting against the conductive structure; and an electronic structure disposed on the dielectric layer and electrically connected to the conductive structure.

The present disclosure also provides a method of manufacturing an electronic package, the method comprises: providing a carrier having a metal layer, and forming a dielectric layer on the metal layer; bonding a conductive structure and a reinforced insulation portion to the dielectric layer, wherein the reinforced insulation portion abuts against the conductive structure; disposing an electronic structure on the dielectric layer, wherein the electronic structure is electrically connected to the conductive structure; and removing the carrier and the metal layer.

In the aforementioned electronic package and method, the dielectric layer has a recess, and the conductive structure and the reinforced insulation portion are disposed in the recess. For instance, the conductive structure is of a pillar or a pad body, and the reinforced insulation portion is located between the dielectric layer and the conductive structure. Alternatively, the conductive structure comprises at least one conductive blind hole disposed in the recess and a pad portion disposed on the conductive blind hole and the dielectric layer, such that the reinforced insulation portion is located in the dielectric layer to contact and abut against the pad portion. Further, a plurality of the conductive blind holes are disposed in the recess, and the pad portion is connected to the plurality of conductive blind holes.

In the aforementioned electronic package and method, a distribution area of a vertical projection area of the conductive structure relative to a surface of the dielectric layer is less than a distribution area of a vertical projection area of the reinforced insulation portion relative to the surface of the dielectric layer.

In the aforementioned electronic package and method, a hardness of the reinforced insulation portion is greater than a hardness of the dielectric layer.

In the aforementioned electronic package and method, a Young's modulus of the reinforced insulation portion is different from a Young's modulus of the dielectric layer.

In the aforementioned electronic package and method, the conductive structure comprises a conductive blind hole formed in the dielectric layer and a conductive circuit disposed on the dielectric layer and connected to the conductive blind hole, wherein the conductive circuit has a pad portion, and the reinforced insulation portion corresponding to the pad portion is embedded in the dielectric layer.

In the aforementioned electronic package and method, the present disclosure further comprises: forming a plurality of conductive pillars on the metal layer prior to removing the carrier and the metal layer, wherein the plurality of conductive pillars extend and penetrate through the dielectric layer and are erected on the dielectric layer; forming an encapsulation layer on the dielectric layer, wherein the encapsulation layer covers the electronic structure and the plurality of conductive pillars; and forming a circuit structure on the encapsulation layer, wherein the circuit structure is electrically connected to the plurality of conductive pillars and the electronic structure.

As can be seen from the above, in the electronic package of the present disclosure and manufacturing method thereof, the reinforced insulation portion is in contact with and abuts against the conductive structure, so that the reinforced insulation portion can support the conductive structure when the electronic structure is disposed on the dielectric layer. Hence, compared with the prior art, the present disclosure can prevent the conductive structure from cracking so as to ensure the process yield.

BRIEF DESCRIPTION OF THE DRAWINGS

FIG. 2A-1, FIG. 2B and FIG. 2C are schematic cross-sectional views illustrating a method of manufacturing an electronic package according to the present disclosure.

FIG. 2A-2 and FIG. 2A-3 are schematic cross-sectional views showing a preceding operation of FIG. 2A-1.

DETAILED DESCRIPTION

Figure 1:
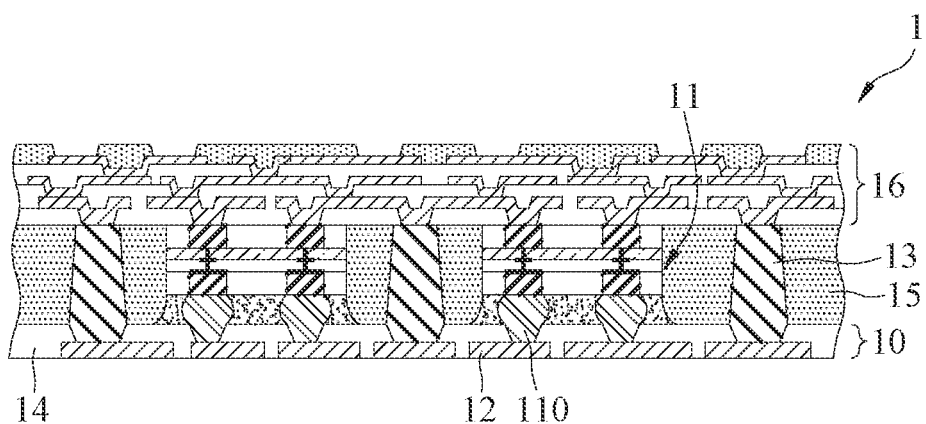
FIG. 1 is a schematic cross-sectional view of a conventional electronic package.

The following describes the implementation of the present disclosure with examples. Those familiar with the art can easily understand the other advantages and effects of the present disclosure from the content disclosed in this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "on," "first," "second," "a," "one," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

Figures 1, 2A:
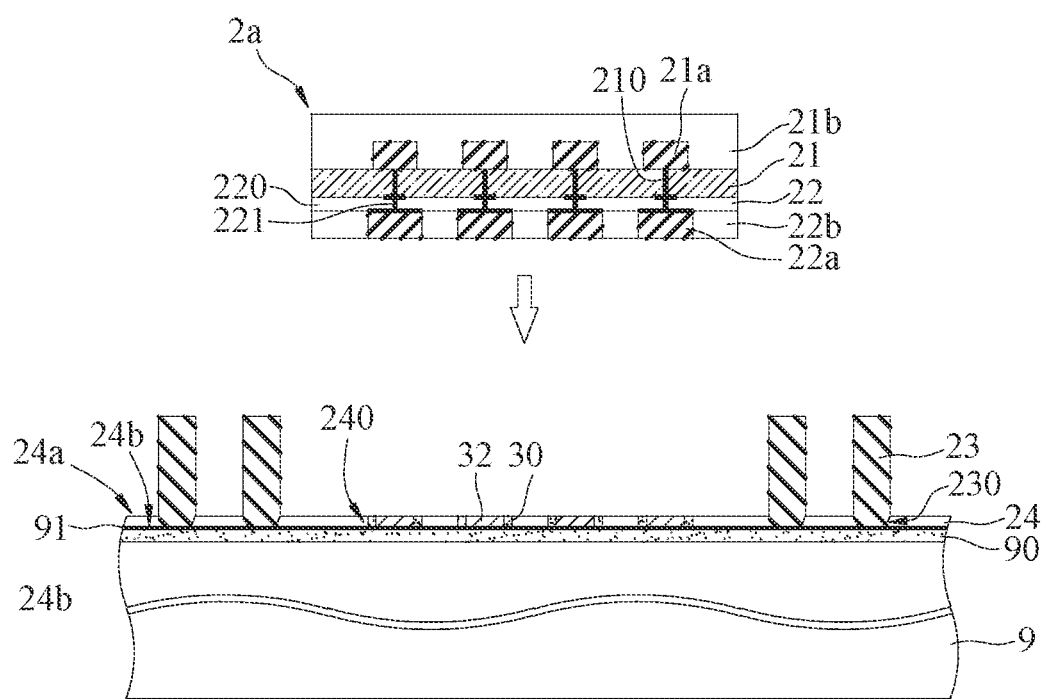
Figures 2, 2A:
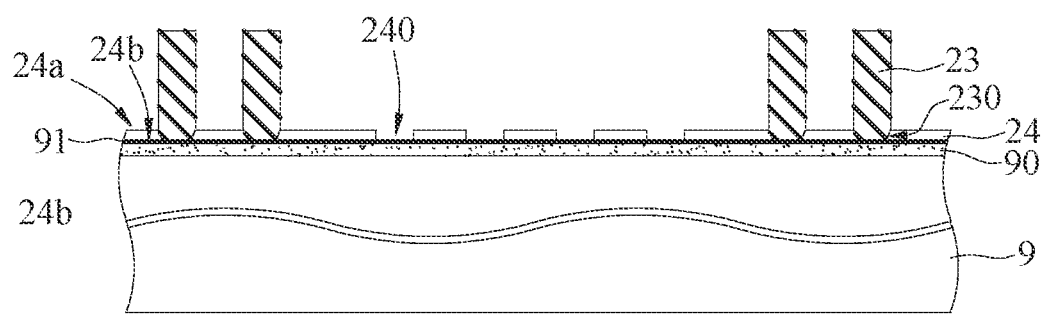
Figures 2, 2A, 3:
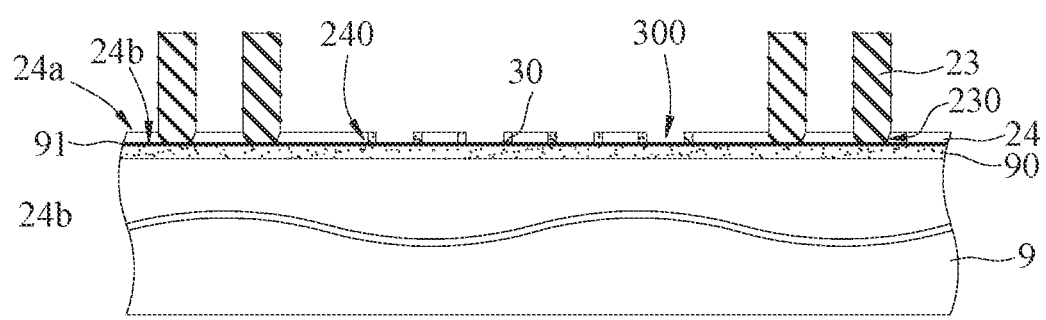
Figure 2B:
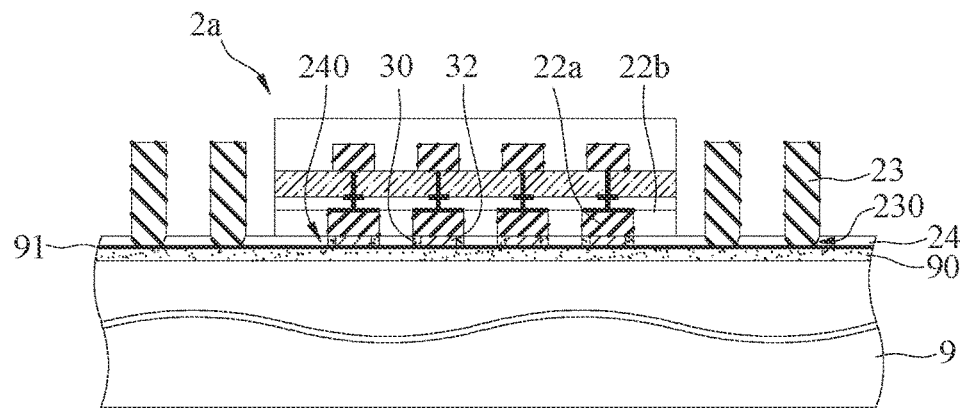
Figure 2C:
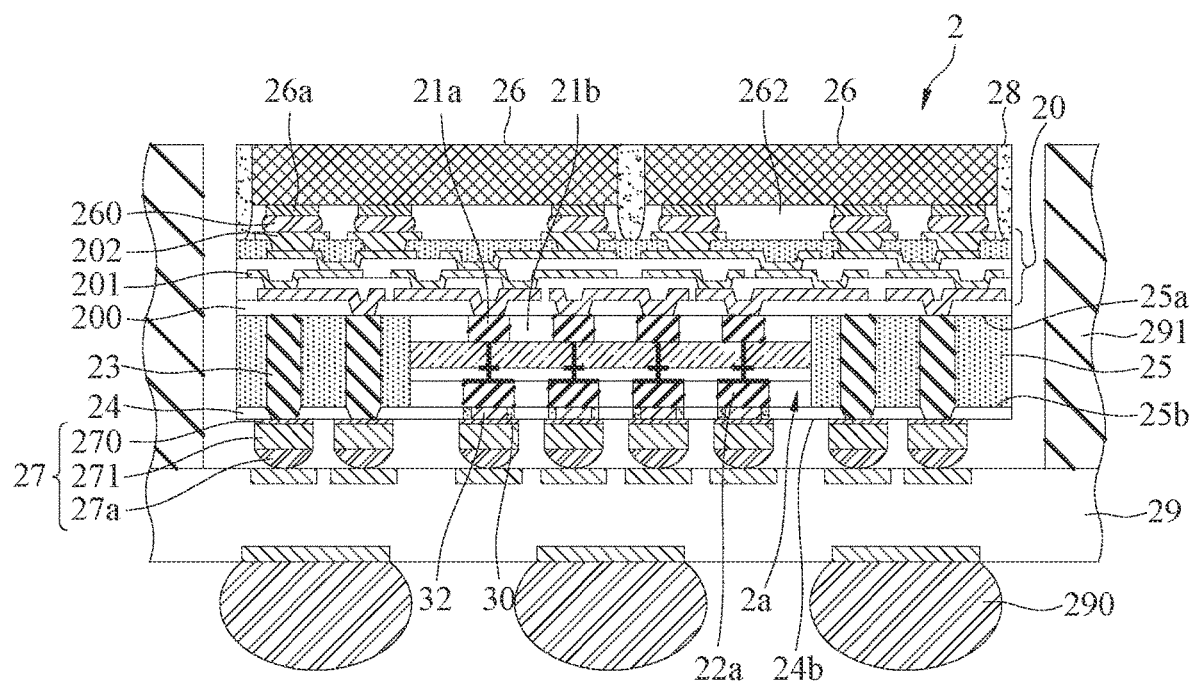

FIG. 2A-1 to FIG. 2C are schematic cross-sectional views illustrating a method of manufacturing an electronic package 2 according to the present disclosure.

As shown in FIG. 2A-1, a carrier 9 with a dielectric layer 24 disposed thereon is provided. The carrier 9 is a plate body made of such as semiconductor material (e.g., silicon or glass). A release layer 90 and a metal layer 91 made of such as titanium/copper are sequentially formed on the carrier 9 by for example coating, so that the dielectric layer 24 is formed on the metal layer 91. For instance, the metal layer 91 is served as a seed layer, and the material for forming the dielectric layer 24 is a dielectric material such as polybenzoxazole (PBO), polyimide (PI), prepreg (PP), or others alike.

In an embodiment, the dielectric layer 24 has a plurality of recesses 240 penetrating therethrough, such that the recesses 240 are exposed from the metal layer 91. Then, a plurality of conductive pillars 23 are formed on the carrier 9, and a conductive structure 32 is formed in each of the recesses 240, wherein a reinforced insulation portion 30 in contact with and abutting against the conductive structure 32 is further formed in each of the recesses 240. For instance, the dielectric layer 24 having the recesses 240 is formed on the metal layer 91 of the carrier 9 first, as shown in FIG. 2A-2. Afterward, each of the recesses 240 is filled up with a reinforced insulation material, and a hollow area 300 is formed in the reinforced insulation material to form the reinforced insulation portion 30, as shown in FIG. 2A-3. Then, the conductive structure 32 is formed in the hollow area 300.

The conductive pillars 23 are metal pillars such as copper pillars or solder structures, and the conductive pillars 23 extend and penetrate through the dielectric layer 24 to contact the metal layer 91. For instance, by means of exposure and development, a plurality of openings 230 exposed from the metal layer 91 are formed on the dielectric layer 24, so that the plurality of conductive pillars 23 are formed by electroplating in the openings 230 from the metal layer 91.

The dielectric layer 24 has a first side 24a and a second side 24b opposing the first side 24a, such that the recesses 240 are in communication with the first side 24a and the second side 24b, and the dielectric layer 24 is bonded to the carrier 9 (or the metal layer 91) via the second side 24b of the dielectric layer 24.

In an embodiment, the recesses 240 are formed by means of exposure and development, therefore the recesses 240 and the openings 230 can be formed together (i.e., the openings 230 and the recesses 240 are formed by one exposure and development operation). It can be understood that the recesses 240 and the openings 230 can also be formed separately (i.e., the openings 230 and the recesses 240 are formed by two exposure and development operations respectively); for example, the openings 230 are formed by a first exposure and development operation, and then the recesses 240 are formed by a second exposure and development operation.

The conductive structures 32 are metal structures, and the manufacturing process of the conductive structures 32 can be performed in conjunction with the manufacturing process of the conductive pillars 23.

In an embodiment, the plurality of conductive structures 32 can be formed by electroplating copper material in the hollow areas 300 from the metal layer 91.

Figure 3A:
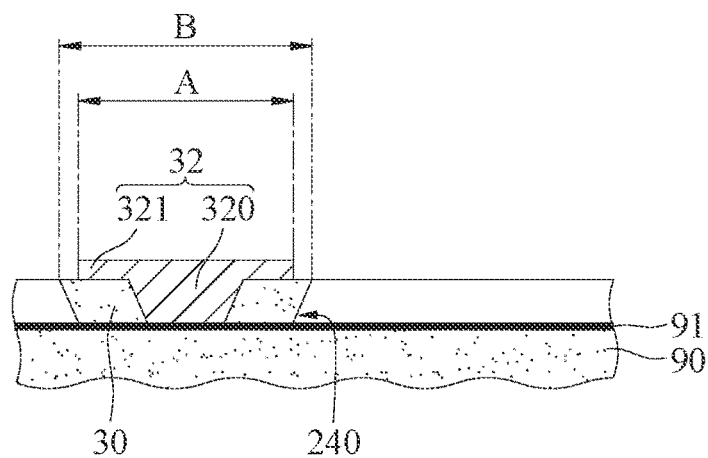
FIG. 3A is a schematic partially enlarged cross-sectional view of FIG. 2A-1.

Moreover, the conductive structure 32 is of a pillar or a pad body, such that the reinforced insulation portion 30 is located between the dielectric layer 24 and the conductive structure 32, so that the conductive structure 32 is surrounded and covered by the reinforced insulation portions 30; alternatively, as shown in FIG. 3A, the conductive structure 32 comprises a conductive blind hole 320 disposed in the recess 240 and a pad portion 321 disposed on the conductive blind hole 320 and the dielectric layer 24, such that the reinforced insulation portion 30 is located between the dielectric layer 24 and the pad portion 321, so that the conductive blind hole 320 is surrounded and covered by the reinforced insulation portions 30. Further, a distribution area A of a vertical projection area of the pad portion 321 of the conductive structure 32 relative to a surface of the dielectric layer 24 is less than a distribution area B of a vertical projection area of the reinforced insulation portions 30 relative to the surface of the dielectric layer 24.

Figure 3B:
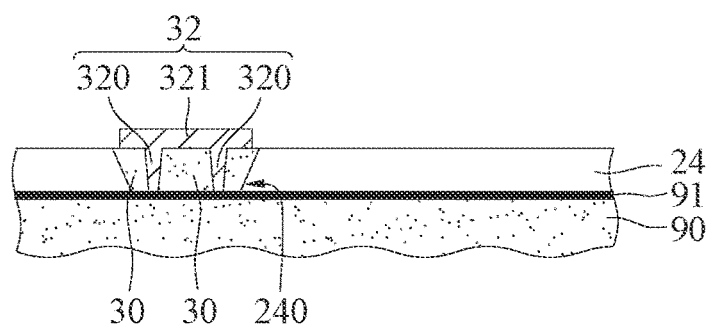
FIG. 3B is a schematic cross-sectional view showing another aspect of FIG. 3A.

In addition, as shown in FIG. 3B, in a single recess 240, the conductive structure 32 also comprises a plurality of conductive blind holes 320 disposed in the recess 240, so that the pad portion 321 is connected to the plurality of conductive blind holes 320 to increase the proportion of the reinforced insulation portions 30 in the recess 240, thereby increasing the support area of the pad portion 321.

The reinforced insulation portion 30 is of a hard dielectric body, and the hardness of the reinforced insulation portion 30 is greater than the hardness of the dielectric layer 24.

In an embodiment, a Young's modulus of the reinforced insulation portion 30 is different from a Young's modulus of the dielectric layer 24. For instance, the Young's modulus of the reinforced insulation portion 30 is greater than the Young's modulus of the dielectric layer 24.

Moreover, the Young's modulus of the reinforced insulation portion 30 is at least greater than 400 GPa. For example, the material for forming the reinforced insulation portion 30 is silicon carbide.

As shown in FIG. 2B, an electronic structure 2a is bonded onto the first side 24a of the dielectric layer 24, such that the electronic structure 2a is electrically connected to the conductive structures 32.

In an embodiment, please refer to FIG. 2A-1 and FIG. 2B at the same time, the electronic structure 2a comprises an electronic body 21, a circuit portion 22, a plurality of first conductors 21a formed on the electronic body 21 and a plurality of second conductors 22a formed on the circuit portion 22 and electrically connected to the circuit portion 22. For instance, a first protection layer 21b is formed on the electronic body 21, such that the plurality of first conductors 21a are covered by the first protection layer 21b, and a second protection layer 22b is formed on the circuit portion 22, such that the plurality of second conductors 22a are covered by the second protection layer 22b, and the plurality of second conductors 22a are exposed from the second protection layer 22b. Therefore, the electronic structure 2a is bonded onto the first side 24a of the dielectric layer 24 via the second protection layer 22b of the electronic structure 2a, and each of the second conductors 22a is correspondingly in contact with and electrically connected to each of the conductive structures 32 (or the pad portions 321).

Furthermore, the electronic body 21 is made of a silicon-based material and is such as a semiconductor chip. The electronic body 21 has a plurality of conductive through vias 210 (such as through-silicon vias [TSVs]) penetrating through the electronic body 21 to be electrically connected to the circuit portion 22 and the plurality of first conductors 21a. For instance, the circuit portion 22 comprises at least a passivation layer 220 and conductive traces 221 bonded to the passivation layer 220, such that the conductive traces 221 are electrically connected to the conductive through vias 210 and the plurality of second conductors 22a. It can be understood that there are various aspects about the component structure of the conductive through via 210, and the present disclosure is not limited to as such.

In addition, the first conductors 21a and the second conductors 22a are metal pillars made of such as copper. The first protection layer 21b is made of an insulating film or polyimide (PI) material, and the first conductors 21a are free from being exposed from the first protection layer 21b. The second protection layer 22b is made of an insulating film, polyimide (PI), or other materials that are easy to adhere to the dielectric layer 24.

As shown in FIG. 2C, an encapsulation layer 25 is formed on the first side 24a of the dielectric layer 24, such that the electronic structure 2a and the plurality of conductive pillars 23 are covered by the encapsulation layer 25, wherein the encapsulation layer 25 has a first surface 25a and a second surface 25b opposing the first surface 25a, such that an end surface of the first protection layer 21b, end surfaces of the plurality of first conductors 21a and end surfaces of the plurality of conductive pillars 23 are exposed from the first surface 25a of the encapsulation layer 25, and the encapsulation layer 25 is bonded onto the first side 24a of the dielectric layer 24 via the second surface 25b of the encapsulation layer 25. Then, a circuit structure 20 is formed on the first surface 25a of the encapsulation layer 25, and the circuit structure 20 is electrically connected to the plurality of conductive pillars 23 and the first conductors 21a. Afterward, a plurality of electronic components 26 are disposed on the circuit structure 20, such that the electronic components 26 are electrically connected to the circuit structure 20, and the electronic components 26 are covered by a packaging layer 28. Finally, the carrier 9 and the release layer 90 on the carrier 9 are removed, and then the metal layer 91 is removed, so as to expose the second side 24b of the dielectric layer 24 and the other end surfaces of the conductive pillars 23. Further, a plurality of the electronic packages 2 can be obtained by performing a singulation process according to requirements.

The encapsulation layer 25 is an insulator made of such as polyimide (PI), dry film, molding colloid of epoxy resin, or molding compound.

In an embodiment, the encapsulation layer 25 can be formed on the dielectric layer 24 by means of liquid compound, injection, lamination, or compression molding.

In addition, by means of leveling process, the first surface 25a of the encapsulation layer 25 can be flush with the end surface of the first protection layer 21b, the end surfaces of the conductive pillars 23 and the end surfaces of the first conductors 21a, such that the end surfaces of the conductive pillars 23 and the end surfaces of the first conductors 21a are exposed from the first surface 25a of the encapsulation layer 25. For instance, the leveling process is to remove a portion of the material of the first protection layer 21b, a portion of the material of each of the conductive pillars 23, a portion of the material of each of the first conductors 21a and a portion of the material of the encapsulation layer 25 by grinding.

The circuit structure 20 comprises at least an insulating layer 200 and at least a circuit layer 201 formed on the insulating layer 200 (e.g., the circuit layer 201 is of a redistribution layer [RDL] specification. A plurality of the insulating layers 200 and a plurality of the circuit layers 201 are shown in drawings of an embodiment, wherein the outermost insulating layer 200 can be used as a solder-resist layer, and the outermost circuit layer 201 is exposed from the solder-resist layer to serve as electrical contact pads 202 such as micro pads (commonly known as μ-pads).

Moreover, the material for forming the circuit layer 201 is copper, and the material for forming the insulating layer 200 is dielectric material such as polybenzoxazole (PBO), polyimide (PI), prepreg (PP), or the like, or solder-resist material such as solder mask (e.g., green paint), graphite (e.g., ink), or the like.

Each of the electronic components 26 is an active element, a passive element, or a combination of the active element and the passive element. The active element is for example a semiconductor chip, and the passive element is for example a resistor, a capacitor, or an inductor.

In an embodiment, each of the electronic components 26 is a semiconductor chip and is electrically connected to the circuit structure 20 via a plurality of conductive bumps 26a such as copper pillars. For instance, the conductive bumps 26a are electrically connected to the electrical contact pads 202 via a solder material 260.

Furthermore, an under bump metallurgy (UBM) layer (not shown) can be formed on the electrical contact pads 202 to facilitate the bonding of the conductive bumps 26a.

The packaging layer 28 is made of an insulating material, such as polyimide (PI), dry film, molding colloid of epoxy resin, or molding compound, and the packaging layer 28 can be formed on the circuit structure 20 by means of lamination or molding. It can be understood that the material for forming the packaging layer 28 can be the same as or different from the material of the encapsulation layer 25.

In an embodiment, a portion of the material of the packaging layer 28 can be removed by a leveling process such as grinding, so that an upper surface of the packaging layer 28 is flush with upper surfaces of the electronic components 26, such that the electronic components 26 are exposed from the packaging layer 28.

Additionally, the packaging layer 28 can cover the electronic components 26 and the conductive bumps 26a at the same time. Alternatively, an underfill 262 can be formed between the electronic components 26 and the circuit structure 20 first to cover the conductive bumps 26a, and then the packaging layer 28 is formed to cover the underfill 262 and the electronic components 26.

Moreover, the metal layer 91 can be used as a barrier to prevent the cracking of the dielectric layer 24 when the release layer 90 is peeled off, and then the metal layer 91 is removed by etching after the carrier 9 and the release layer 90 on the carrier 9 are removed. At this time, the conductive pillars 23 and the conductive structures 32 are exposed from the second side 24b of the dielectric layer 24, so that a plurality of conductive components 27 can be bonded on the second side 24b of the dielectric layer 24, such that the plurality of conductive components 27 are electrically connected to the plurality of conductive pillars 23 and the plurality of conductive structures 32.

Each of the conductive components 27 can comprise a metal body 270 (e.g., a UBM) bonded to the conductive pillar 23 and the conductive structure 32, and a copper pillar 271 bonded to the metal body 270, and a solder material 27a such as a solder bump or a solder ball is formed on an end surface of the copper pillar 271.

It can be understood that when the quantity of the contacts (IO) of the electronic package 2 is insufficient (e.g., the quantity of the conductive components 27 can no longer meet the product requirements), the layer-building operation can still be performed by RDL process to form a routing structure (not shown) such as the circuit structure 20 on the second side 24b of the dielectric layer 24 to electrically connect the conductive pillars 23 and the second conductors 22a, so that the quantity and locations of the IO of the electronic package 2 can be reconfigured, therefore more conductive components 27 can be bonded on the outermost circuit layer of the routing structure.

Thus, in the electronic package 2 of the present disclosure, a silicon carbide layer with harder hardness is formed between the dielectric layer 24 and the conductive structure 32 (or the conductive blind hole 320) to be used as the reinforced insulation portion 30, so that the reinforced insulation portions 30 can support the conductive structures 32 when the electronic structure 2a is disposed on the dielectric layer 24. Hence, compared with the prior art, the reinforced insulation portions 30 and the dielectric layer 24 can withstand and disperse the pressure of the electronic structure 2a, so as to prevent the conductive structures 32 or the conductive blind holes 320 (even the metal layer 91) from cracking due to the inability of the dielectric layer 24 to withstand the pressure of the electronic structure 2a.

Figure 3C:
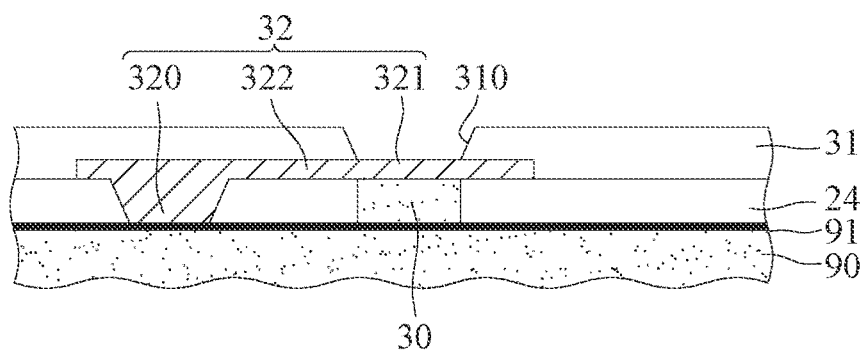
FIG. 3C is a schematic cross-sectional view showing a further aspect of FIG. 3A.

It can be understood that the reinforced insulation portion 30 only needs to support the conductive structure 32. For instance, in another embodiment, as shown in FIG. 3C, the conductive structure 32 comprises the conductive blind hole 320 formed in the dielectric layer 24 and a conductive circuit 322 disposed on the dielectric layer 24 and connected to the conductive blind hole 320. The conductive circuit 322 has the pad portion 321, such that one end of the conductive circuit 322 is connected to the conductive blind hole 320, and the pad portion 321 is disposed on the other end of the conductive circuit 322, so that the reinforced insulation portion 30 corresponding to the pad portion 321 is embedded in the dielectric layer 24. Therefore, the reinforced insulation portion 30 is in contact with and abuts against the pad portion 321 and supports the pad portion 321, so that there is no need to arrange the reinforced insulation portion 30 at the conductive blind hole 320.

Furthermore, another dielectric layer can be formed on the dielectric layer 24 to be used as an insulating protection layer 31, and the insulating protection layer 31 has at least an opening 310 exposing the pad portion 321, so that the second conductor 22a of the electronic structure 2a is disposed on the pad portion 321 corresponding to the opening 310.

In addition, in a subsequent process, as shown in FIG. 2C, the electronic package 2 can be connected to a packaging substrate 29 or a circuit board (not shown) via the plurality of conductive components 27. For instance, if the plurality of conductive components 27 are connected to the packaging substrate 29, a plurality of solder balls 290 can be formed on a lower side of the packaging substrate 29 via a ball-placement process for connecting to a circuit board (not shown).

Moreover, a strengthener 291 such as a metal frame can be disposed on an upper side of the packaging substrate 29 to eliminate the stress concentration issue so as to prevent the electronic package 2 from warping.

The present disclosure also provides an electronic package 2, which comprises: a dielectric layer 24, a plurality of conductive structures 32 bonded to the dielectric layer 24, a plurality of reinforced insulation portions 30 bonded to the dielectric layer 24 and abutting against the conductive structures 32, and at least an electronic structure 2a disposed on the dielectric layer 24 and electrically connected to the conductive structures 32.

In an embodiment, the dielectric layer 24 has at least a recess 240, such that the conductive structure 32 and the reinforced insulation portions 30 are disposed in the recess 240. For instance, the conductive structure 32 is a pillar or a pad body, such that the reinforced insulation portion 30 is positioned between the dielectric layer 24 and the conductive structure 32, so that the conductive structure 32 is surrounded and covered by the reinforced insulation portions 30. Alternatively, the conductive structure 32 comprises at least a conductive blind hole 320 disposed in the recess 240 and a pad portion 321 disposed on the conductive blind hole 320 and the dielectric layer 24, such that the reinforced insulation portion 30 is positioned in the dielectric layer 24 to contact and abut against the pad portion 321. Further, a plurality of the conductive blind holes 320 are disposed in the recess 240, so that the pad portion 321 is connected to the plurality of conductive blind holes 320.

In an embodiment, a distribution area A of a vertical projection area of the conductive structure 32 relative to a surface of the dielectric layer 24 is less than a distribution area B of a vertical projection area of the reinforced insulation portions 30 relative to the surface of the dielectric layer 24.

In an embodiment, a hardness of the reinforced insulation portion 30 is greater than a hardness of the dielectric layer 24.

In an embodiment, a Young's modulus of the reinforced insulation portion 30 is different from a Young's modulus of the dielectric layer 24.

In an embodiment, the conductive structure 32 comprises the conductive blind hole 320 formed in the dielectric layer 24, and a conductive circuit 322 disposed on the dielectric layer 24 and connected to the conductive blind hole 320, wherein the conductive circuit 322 has the pad portion 321, so that the reinforced insulation portion 30 corresponding to the pad portion 321 is embedded in the dielectric layer 24.

In an embodiment, the electronic package 2 further comprises: a plurality of conductive pillars 23 disposed on the dielectric layer 24 and extending into the dielectric layer 24, an encapsulation layer 25 formed on the dielectric layer 24 and covering the electronic structure 2a and the plurality of conducive pillars 23, and a circuit structure 20 disposed on the encapsulation layer 25 and electrically connected to the plurality of conductive pillars 23 and the electronic structure 2a.

To sum up, in the electronic package of the present disclosure and manufacturing method thereof, the reinforced insulation portions abut against the conductive structures and are embedded in the dielectric layer so as to support the conductive structures. Therefore, the problem of cracking of the conductive structures can be avoided when the electronic structure is disposed on the dielectric layer, thereby ensuring the process yield.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. An electronic package, comprising:
a dielectric layer;
a conductive structure bonded to the dielectric layer;
a reinforced insulation portion bonded to the dielectric layer and abutting against the conductive structure, wherein the conductive structure is supported by the reinforced insulation portion; and
an electronic structure disposed on the dielectric layer and electrically connected to the conductive structure, wherein the electronic structure is supported by the dielectric layer and the reinforced insulation portion.

2. The electronic package of claim 1, wherein the dielectric layer has a recess, and the conductive structure and the reinforced insulation portion are disposed in the recess.

3. The electronic package of claim 2, wherein the conductive structure is of a pillar or a pad body, and the reinforced insulation portion is located between the dielectric layer and the conductive structure.

4. The electronic package of claim 2, wherein the conductive structure comprises at least one conductive blind hole disposed in the recess and a pad portion disposed on the conductive blind hole and the dielectric layer, such that the reinforced insulation portion is located in the dielectric layer to contact and abut against the pad portion.

5. The electronic package of claim 4, wherein a plurality of the conductive blind holes are disposed in the recess, and the pad portion is connected to the plurality of conductive blind holes.

6. The electronic package of claim 1, wherein a distribution area of a vertical projection area of the conductive structure relative to a surface of the dielectric layer is less than a distribution area of a vertical projection area of the reinforced insulation portion relative to the surface of the dielectric layer.

7. The electronic package of claim 1, wherein a hardness of the reinforced insulation portion is greater than a hardness of the dielectric layer.

8. The electronic package of claim 1, wherein a Young's modulus of the reinforced insulation portion is different from a Young's modulus of the dielectric layer.

9. The electronic package of claim 1, wherein the conductive structure comprises a conductive blind hole formed in the dielectric layer and a conductive circuit disposed on the dielectric layer and connected to the conductive blind hole, wherein the conductive circuit has a pad portion, and the reinforced insulation portion corresponding to the pad portion is embedded in the dielectric layer.

10. The electronic package of claim 1, further comprising:
a plurality of conductive pillars disposed on and extending into the dielectric layer;
an encapsulation layer formed on the dielectric layer and covering the electronic structure and the plurality of conducive pillars; and
a circuit structure disposed on the encapsulation layer and electrically connected to the plurality of conductive pillars and the electronic structure.

* * * * *